(12) United States Patent
Hoffman

(10) Patent No.: US 7,250,627 B2
(45) Date of Patent: Jul. 31, 2007

(54) SEMICONDUCTOR DEVICE

(75) Inventor: Randy L. Hoffman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/799,325

(22) Filed: Mar. 12, 2004

(65) Prior Publication Data

US 2005/0199967 A1    Sep. 15, 2005

(51) Int. Cl.
H01L 29/04 (2006.01)
H01L 31/036 (2006.01)
H01L 31/0376 (2006.01)
H01L 31/20 (2006.01)

(52) U.S. Cl. .............. 257/59; 257/66; 257/72
(58) Field of Classification Search ............. 257/43, 257/59, 66, 72
See application file for complete search history.

(56) References Cited

U.S. PATENT DOCUMENTS

| | | | |
|---|---|---|---|
| 4,559,238 A | 12/1985 | Bujatti et al. | |
| 5,107,314 A | 4/1992 | Kahng et al. | |
| 5,744,864 A | 4/1998 | Cillessen et al. | |
| 2003/0047785 A1 | 3/2003 | Kawasaki et al. | |
| 2003/0104659 A1 | 6/2003 | Arakawak et al. | |
| 2003/0111663 A1 | 6/2003 | Yagi | |
| 2003/0139026 A1 | 7/2003 | Lucovosky | |
| 2003/0180996 A1 | 9/2003 | Yamazaki et al. | |
| 2003/0186489 A1 | 10/2003 | Ishikawa | |
| 2003/0218221 A1 | 11/2003 | Wager, III et al. | |
| 2003/0218222 A1 | 11/2003 | Wager, III et al. | |
| 2003/0224550 A1 | 12/2003 | Kokubo et al. | |

FOREIGN PATENT DOCUMENTS

| | | |
|---|---|---|
| EP | 1134811 | 9/2001 |
| EP | 1 306 858 | 5/2003 |
| EP | 1 367 657 | 12/2003 |
| WO | WO 97-065514 | 2/1997 |
| WO | WO 02/15233 | 2/2002 |

OTHER PUBLICATIONS

Aoki, Akira, et al., "Tin Oxide Thin Film Transistors", Japan J. Appl. Phys., vol. 9, p. 582 (1970).
Carcia, P.F., et al., "Transparent ZnO thin-film transistor fabricated by rf magnetron sputtering", Applied Physics Letters, vol. 82, No. 7, pp. 1117-1119 (Feb. 17, 2003).
Carcia, P.F., et al., "ZnO Thin Film Transistors for Flexible Electronics", Mat. Res. Soc. Symp. Proc., vol. 769, pp. H72.1-H72.6 (2003).
U.S. Appl. No. 60/490,239, filed Jul. 25, 2003, Transparent Thin Film Transistor with Zinc-Tin Oxide Channel . . . .
U.S. Appl. No. 10/763,239, filed Jan. 26, 2004, Semiconductor Device.
U.S. Appl. No. 10/763,354, filed Jan. 23, 2004, Transistor Including a Deposited Channel Region Having a . . . .
Fu, Shelton, et al., "MOS and MOSFET with Transistion Metal Oxides", SPIE vol. 2697, pp. 520-527.

(Continued)

Primary Examiner—Thien F Tran (57) ABSTRACT

A semiconductor device can include a channel including a gallium oxide film.

21 Claims, 6 Drawing Sheets

OTHER PUBLICATIONS

Giesbers, J.B., et al., "Dry Etching of All-Oxide Transparent Thin Film Memory Transistors", Microelectronic Engineering, vol. 35, pp. 71-74 (1997).

Grosse-Holz, K.O., et al. "Semiconductive Behavior of Sb Doped $SnO_2$ Thin Films", Mat. Res. Soc. Symp. Proc., vol. 401, pp. 67-72 (1996).

Hajnal, Zoltán, et al., "Role of oxygen vacancy defect states in the N-type conduction of $B-Ga_2O_3$", Journal of Applied Physics, vol. 86, No. 7, pp. 3792-3796 (Oct. 1, 1999).

Hajnal, Z., et al., "Theoretical Investigation of the Oxygen Vacancies in $B-Ga_2O_3$", Rapid Research Notes, Phys. Stat. Sol. (a), vol. 171, No. R5 (1999).

Hoffman, R.L., et al., "ZnO-based transparent thin-film transistors", Applied Physics Letters, vol. 82, No. 5, pp. 733-735 (Feb. 3, 2003).

Masuda, Satoshi, et al., "Transparent thin film transistors using ZnO as an active channel layer and their electrical properties", Journal of Applied Physics, vol. 93, No. 3, pp. 1624-1630 (Feb. 1, 2003).

Nakano, Yoshitaka, et al. "Electrical properties of thermally oxidized p-GaN metal-oxide-semiconductor diodes", Applied Physics Letters, vol. 82 No. 15, pp. 2443-2445 (Apr. 14, 2003).

Nishi, Junya, et al., "High Mobility Thin Film Transistors with Transparent ZnO Channels", Jpn. J. Appl. Phys., vol. 42, Part 2, No. 4A, pp. L347-L349 (Apr. 2003).

Ohya, Yutaka, et al., "Thin Film Transistor of ZnO Fabricated by Chemical Solution Deposition", Jpn. J. Appl. Phys., vol 40, Part 1, No. 1, pp. 297-298 (Jan. 2001).

Orita, Masahiro, et al., Deep-ultraviolet transparent conductive $B-Ga_2O_3$ thin films, Applied Physics Letters, vol. 77, No. 25, pp. 4166-4168 (Dec. 18, 2002).

Oritia, Masahiro, et al., "Preparation of highly conductive, deep ultraviolet transparent $B-Ga_2O_3$ thin flim at low deposition temperatures", Thin Solid Films, vol. 411, pp. 134-139 (2002).

Pallecchi, Ilaria, et al. "$SrTiO_3$-based metal-insulator-semiconductor heterostructrues" Applied Physics Letters, vol. 78, No. 15, pp. 2244-2246 (Apr. 9, 2001).

Prins, M. W. J., et al., "A ferroelectric transparent thin-film transistor", Applied Physics Letters, vol. 68, No. 25, pp. 3650-3652 (Jun. 17, 1996).

Seager, C.H., et al., "Charge Trapping and device behavior in ferroelectric memories", Appl. Phys. Lett., vol. 68, No. 19, pp. 2660-2662 (May 6, 1996).

Ueda, Naoyuki, et al. "Anistrophy of electrical optical properties in $BOGa_2O_3$ single crystals", Appl. Phys. Lett., vol. 71, No. 7, pp. 933-935 (Aug. 18, 1997).

Ueda, Naoyuki, et al., "Systhesis and control of conductiviity of ultraviolet transmitting $B-Ga_2O_3$ single crystals", Appl. Phys. Lett., vol. 70, No. 21, pp. 3561-3563 (Jun. 30, 1997).

Uneno, K., et al. "Field-effect transistor on $SrTiO_3$ with sputtered $Al_2O_3$ gate insulator", Applied Physics Letter, vol. 83, No. 9, pp. 1755-1757 (Sep. 1, 2003).

Wöllensteien, Jürgen, et al., "An isulated gate thin-film transistor using $SnO_2$ as semiconducting channel, a possible new gas sensor device" The 11th European Conference on Solid State Transducers, pp. 471-474 (Sep. 21-24, 1997).

Yoshida, A., "Three Terminal Field Effect Superconducting Device Using $SrTiO_3$ Channel" IEEE Transactions on Applied Superconductivity, vol. 5, No. 2, pp. 2892-2895 (Jun. 1995).

Solid-State Electronics, vol. 7, Pergamon Press, Notes pp. 701-702 (1964).

Anonymous, "Transparent and/or memory thin film transistors in LCD's and PLEAD_" Research Disclosure, p. 890 (Jul. 1998).

Ohta, H., "Frontier of transparent oxide semiconductors", Solid State Electronics, vol. 47, No. 12, Dec. 2003, pp. 2261-2267.

Ogita, M., "Properties of gallium oxide thin film . . . ", Proceedings of the 27th annual conf. of the IEEE Ind. Elect. Society, Nov. 29-Dec. 2, 2001, vol. 1 of 3, conf 27, pp. 137-140.

Villora, E.G., et al.. "Infrared Reflectance and Electrical Conductivity of $B-GA_2O_3$", Phys. Stat. Sol. (a), Vo. 193, No. 1, pp. 187-195 (2002).

SEMICONDUCTOR DEVICE

INTRODUCTION

Semiconductor devices are used in a variety of electronic devices. For example, thin-film transistors technology can be used in liquid crystal display (LCD) screens. Some types of thin-film transistors have relatively slow switching speeds because of low carrier mobility. In some applications, such as LCD screens, use of thin-film transistors with relatively slow switching speeds can make it difficult to accurately render motion.

DETAILED DESCRIPTION

The exemplary embodiments of the present disclosure include semiconductor devices, such as transistors, that contain gallium oxide. Additionally, exemplary embodiments of the disclosure account for the properties possessed by semiconductor device that contain gallium oxide, e.g. optical transparency, and electrical performance. Exemplary embodiments include semiconductor devices that contain a channel of gallium oxide. In some of the exemplary embodiments, the gallium oxide can include an amorphous form, a single-phase crystalline state, or a mixed-phase crystalline state.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It should be understood that the various semiconductor devices may be employed in connection with the various embodiments of the present disclosure, i.e., field effect transistors including thin-film transistors, active matrix displays, logic inverters, and amplifiers. FIGS. 1A-1F illustrate exemplary thin-film transistor embodiments. The thin-film transistors can be of any type, including but not limited to, horizontal, vertical, coplanar electrode, staggered electrode, top-gate, bottom-gate, single-gate, and double-gate, to name a few.

As used herein, a coplanar electrode configuration is intended to mean a transistor structure where the source and drain electrodes are positioned on the same side of the channel as the gate electrode. A staggered electrode configuration is intended to mean a transistor structure where the source and drain electrodes are positioned on the opposite side of the channel as the gate electrode.

Figure 1A:
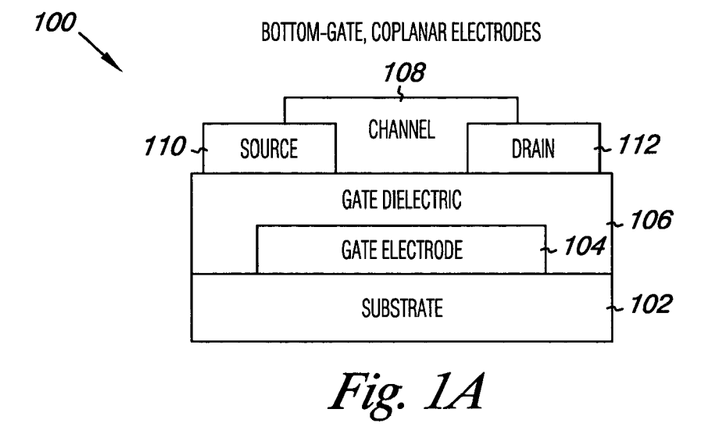
FIGS. 1A-1F illustrate various embodiments of a semiconductor device, such as a thin-film transistor.
Figure 1B:
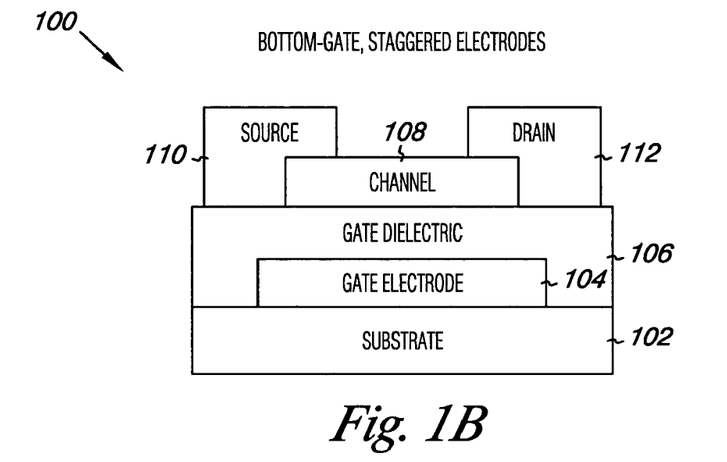
Figure 1C:
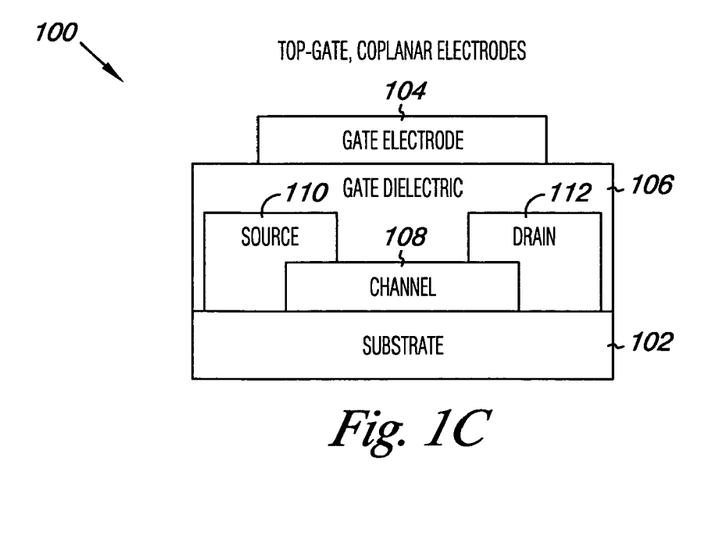
Figure 1D:
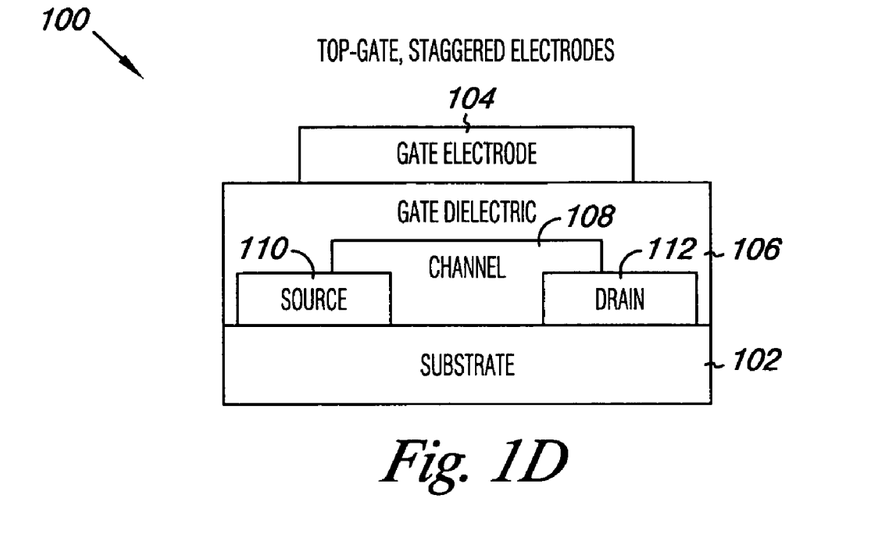
Figure 1E:
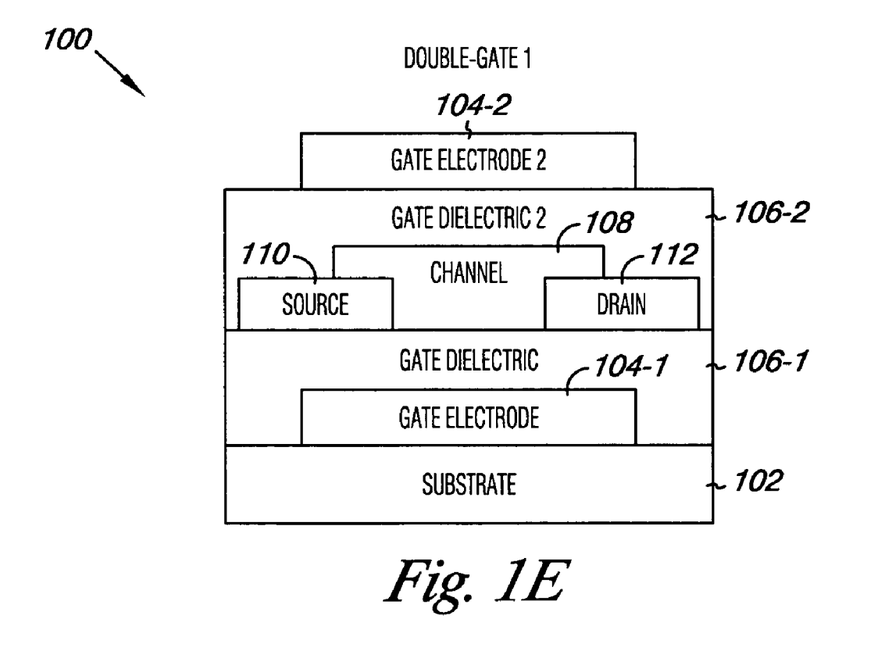
Figure 1F:
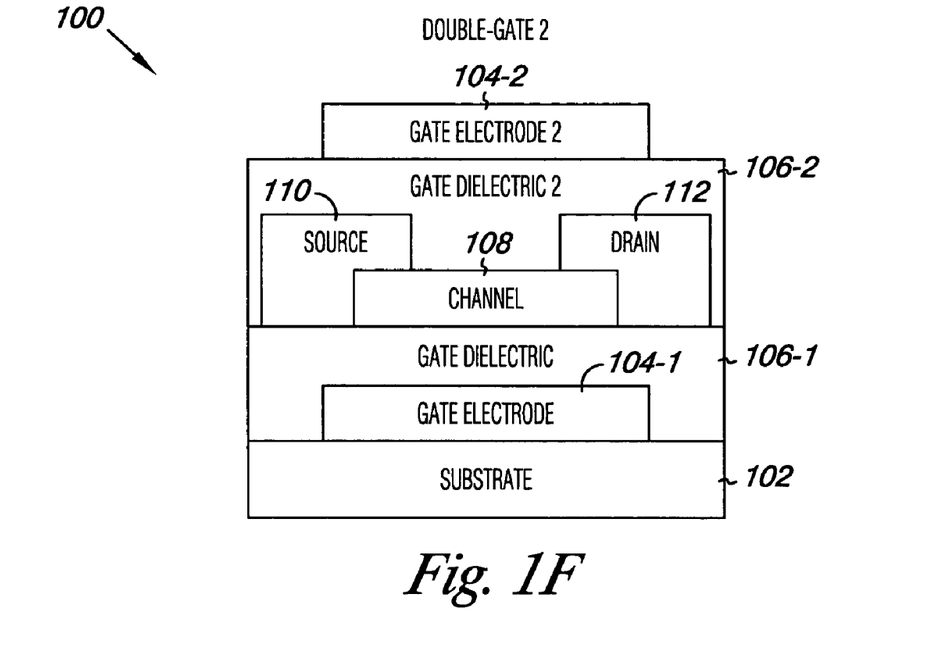

FIGS. 1A and 1B illustrate embodiments of bottom-gate transistors, FIGS. 1C and 1D illustrate embodiments of top-gate transistors, and FIGS. 1E and 1F illustrate embodiments of double-gate transistors. In each of FIGS. 1A-1D, the transistors 100 include a substrate 102, a gate electrode 104, a gate dielectric 106, a channel 108, a source electrode 110, and a drain electrode 112. In each of FIGS. 1A-1D, the gate dielectric 106 is positioned between the gate electrode 104 and the source and drain electrodes 110, 112 such that the gate dielectric 106 physically separates the gate electrode 104 from the source and the drain electrodes 110, 112. Additionally, in each of the FIGS. 1A-1D, the source and the drain electrodes 110, 112 are separately positioned thereby forming a region between the source and drain electrodes 110, 112 for interposing the channel 108. Thus, in each of FIGS. 1A-1D, the gate dielectric 106 is positioned adjacent the channel 108, and physically separates the source and drain electrodes 110, 112 from the gate electrode 104. Additionally, in each of the FIGS. 1A-1D, the channel 108 is positioned adjacent the gate dielectric 106 and contacts the source and drain electrodes 110, 112.

In various embodiments, such as in the double-gate embodiments shown in FIGS. 1E and 1F, two gate electrodes 104-1, 104-2 and two gate dielectrics 106-1, 106-2 are illustrated. In such embodiments, the positioning of the gate dielectrics 106-1, 106-2 relative to the channel 108 and the source and drain electrodes 110, 112, and the positioning of the gate electrodes 104-1, 104-2 relative to the gate dielectrics 106-1, 106-2 follow the same positioning convention described above where one gate dielectric and one gate electrode are illustrated. That is, the gate dielectrics 106-1, 106-2 are positioned between the gate electrodes 104-1, 104-2 and the source and drain electrodes 110, 112 such that the gate dielectrics 106-1, 106-2 physically separate the gate electrodes 104-1, 104-2 from the source and the drain electrodes 110, 112.

In each of FIGS. 1A-1F, the channel 108 interposed between the source and the drain electrodes 110, 112 provide a controllable electric pathway between the source and drain electrodes 110, 112 such that when a voltage is applied to the gate electrode 104, an electrical charge can move between the source and drain electrodes 110, 112 via the channel 108. The voltage applied at the gate electrode 104 can vary the ability of the channel 108 to conduct the electrical charge and thus, the electrical properties of the channel 108 can be controlled, at least in part, through the application of a voltage at the gate electrode 104.

Figure 2:
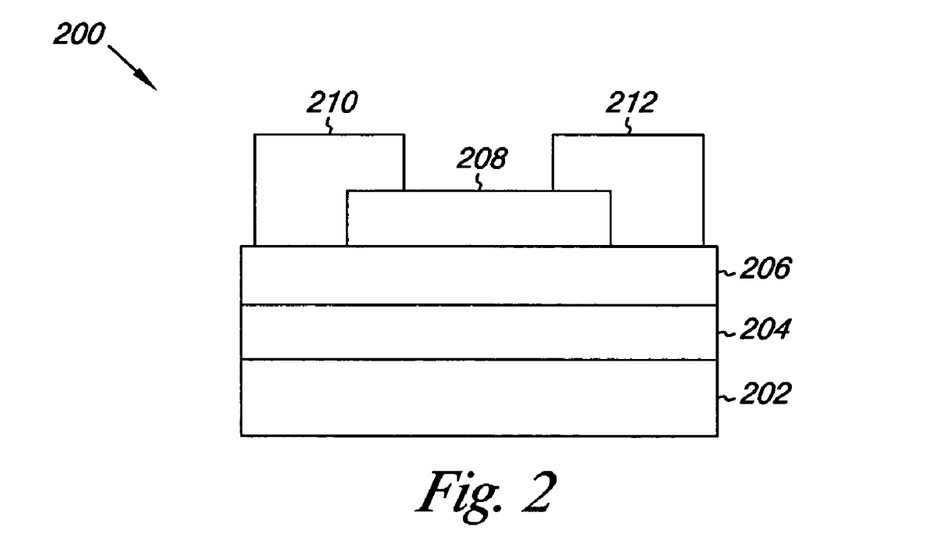
FIG. 2 illustrates a cross-sectional schematic of an embodiment of a thin-film transistor.

A more detailed description of an embodiment of a thin-film transistor is illustrated in FIG. 2. FIG. 2 illustrates a cross-sectional view of an exemplary bottom gate thin-film transistor 200. It will be appreciated that the different layers of the thin-film transistor described in FIG. 2, the materials in which they constitute, and the methods in which they are formed can be equally applicable to any of the transistor embodiments described herein, including those described in connection with FIGS. 1A-1F.

Moreover, in the various embodiments, the thin-film transistor 200 can be included in a number of devices including an active matrix display screen device, a logic inverter, and an amplifier. The thin-film transistor 200 can also be included in an infrared device, where transparent components are also used.

As shown in FIG. 2, the thin-film transistor 200 can include a substrate 202, a gate electrode 204 positioned adjacent the substrate 202, a gate dielectric 206 positioned adjacent the gate electrode 204, and a channel 208 contacting the gate dielectric 206, a source electrode 210, and a drain electrode 212. In the various embodiments, the channel 208 can be positioned between and electrically couple the source electrode 210 and the drain electrode 212.

In the embodiment shown in FIG. 2, the substrate 202 includes glass. However, substrate 202 can include any suitable substrate material or composition for implementing the various embodiments, as will be more fully discussed in connection with FIG. 3.

The substrate 202 illustrated in FIG. 2 includes a blanket coating of ITO, i.e., indium-tin oxide to form the gate electrode 204 layer. However, any number of materials can be used for the gate electrode 204. Such materials can include transparent materials such as an n-type doped $In_2O_3$, $SnO_2$, or ZnO, and the like. Other suitable materials include metals such as In, Sn, Ga, Zn, Al, Ti, Ag, Cu, and the like. In the embodiment illustrated in FIG. 2, the thickness of the gate electrode 204 is approximately 200 nm. The thickness of a gate electrode layer can vary depending on the materials used, device type, and other factors.

The gate dielectric 206 shown in FIG. 2 is also blanket coated. Although the gate electrode 204 and gate dielectric 206 are shown as blanket coated, unpatterned layers in FIG. 2, they can be patterned. In the various embodiments, the gate dielectric layer 206 can include various layers of different materials having insulating properties representative of gate dielectrics. Such materials can include tantalum pentoxide ($Ta_2O_5$), Strontium Titanate (ST), Barium Strontium Titanate (BST), Lead Zirconium Titanate (PZT), Strontium Bismuth Tantalate (SBT) and Bismuth Zirconium Titanate (BZT), silicon dioxide ($SiO_2$), silicon nitride ($Si_3N_4$), magnesium oxide (MgO), aluminum oxide ($Al_2O_3$), hafnium(IV)oxide ($HfO_2$), zirconium(IV)oxide ($ZrO_2$), various organic dielectric materials, and the like.

In the various embodiments, the source electrode 210 and the drain electrode 212 are separately positioned adjacent the gate dielectric 206. In the embodiment shown in FIG. 2, the source and drain electrodes 210, 212 can be formed from the same materials as those discussed in regards to the gate electrode 204. In FIG. 2, the source and drain electrodes 210, 212 have a thickness of approximately 200 nm. However, the thickness can vary depending on composition of material used, application in which the material will be used, and other factors. The choice of source and drain electrode material can vary depending on the application, device, system, etc., in which they will be used. Overall device performance is likely to vary depending on the source and drain materials. For example, in devices where a substantially transparent thin-film transistor is desired, the materials for the source, drain, and gate electrodes can be chosen for that effect.

In the various embodiments, the channel 208 can be formed from a binary material containing gallium and oxygen to form gallium oxide (e.g., $Ga_xO_y$, wherein x=1 or 2 and y=1 or 3). In the various embodiments, these materials can include various morphologies depending on composition, processing conditions, and other factors. The various morphological states can include amorphous states, and polycrystalline states. A polycrystalline state can include a single-phase crystalline state or a mixed-phase crystalline state. The various morphologies of the materials forming the channel 208 will be more fully discussed below in connection with FIG. 3. Additionally, in the various embodiments, the source, drain, and gate electrodes can include a substantially transparent material. By using substantially transparent materials for the source, drain, and gate electrodes, areas of the thin-film transistor can be transparent to the portion of the electromagnetic spectrum that is visible to the human eye. In the transistor arts, a person of ordinary skill will appreciate that devices such as active matrix liquid crystal displays having display elements (pixels) coupled to thin-film transistors (TFT's) having substantially transparent materials for selecting or addressing the pixel to be on or off will benefit display performance by allowing more light to be transmitted through the display.

Referring back to FIG. 2, the channel 208 is formed of a gallium oxide with a thickness of about 50 nm, however, in various embodiments the thickness of can vary depending on a variety of factors including whether the channel material is amorphous or polycrystalline, and the device in which the channel is to be incorporated.

In this embodiment, the channel 208 is positioned adjacent the gate dielectric 206 and between the source and drain electrodes 210, 212, so as to contact and electrically couple the electrodes 210 and 212. An applied voltage at the gate electrode 204 can facilitate electron accumulation in the channel 208. In addition, the applied voltage can enhance electron injection from the source electrode 210 to the channel 208 and electron extraction therefrom by the drain electrode 212. In the embodiments of the present disclosure, the channel 208 can allow for on/off operation by controlling current flowing between the drain electrode 212 and the source electrode 210 using a voltage applied to the gate electrode 204.

Herein, "gallium oxide" can include the form of a gallium-containing film. Gallium oxide, as described herein (specifically $\beta$-$Ga_2O_3$) shows a very satisfactory bandgap $E_G$ (~4.5-4.8 eV). Due to this increased bandgap, gallium oxide is transparent not only in the visible spectrum but well into the near-UV. Thus, the use of a gallium oxide provides a useful component in the design of optoelectronic circuits where insensitivity to near-UV radiation is desired. Although the mobility of gallium oxides is typically substantially smaller than that of other oxide semiconductors (e.g., ZnO, $SnO_2$), this may be acceptable in cases where its UV-transparency can be leveraged. The transparency of the gallium oxide for the channel allows the possibility for an entire thin-film transistor to be optically transparent throughout the visible region of the electromagnetic spectrum.

The use of gallium oxide illustrated in the embodiments of the present disclosure is beneficial for a wide variety of thin-film applications in integrated circuit structures. For example, such applications include transistors, as discussed herein, such as thin-film transistors, horizontal, vertical, coplanar electrode, staggered electrode, top-gate, bottom-gate, single-gate, and double-gate, to name only a few. In the various embodiments, transistors (e.g., thin-film-transistors) of the present disclosure can be provided as switches or amplifiers, where applied voltages to the gate electrodes of the transistors can affect a flow of electrons through the channel of gallium oxide. As one of ordinary skill will appreciate, transistors can operate in a variety of ways. For example, when a transistor is used as a switch, the transistor can operate in the saturation region, and where a transistor is used as an amplifier, the transistor can operate in the linear region. In addition, the use of transistors incorporating a channel of gallium oxide in integrated circuits and structures incorporating integrated circuits such as visual display panels (e.g., active matrix LCD displays) such as that shown and described in connection with FIG. 5 below. In display applications and other applications, since gallium oxide is itself optically transparent, it will often be desirable to fabricate one or more of the remaining thin-film transistor layers, e.g., source, drain, and gate electrodes, to be at least partially transparent.

In FIG. 2, the source electrode 210 and the drain electrode 212 include an ITO layer having a thickness of about 200 nm. In the various embodiments however, the thickness can vary depending on a variety of factors including type of materials, applications, and other factors. In various embodiments, the electrodes 210, 212, may include a transparent conductor, such as an n-type doped wide-bandgap semiconductor. Examples include, but are not limited to, n-type doped $In_2O_3$, $SnO_2$, indium-tin oxide (ITO), or ZnO, and the like. The electrodes 210, 212 may also include a metal such as In, Sn, Ga, Zn, Al, Ti, Ag, Cu, Au, Pt, W, or Ni, and the like. In the various embodiments of the present disclosure, all of the electrodes 204, 210, and 212 may include transparent materials such that the various embodiments of the transistors may be made substantially transparent.

The various layers of the transistor structures described herein can be formed using a variety of techniques. For example, the gate dielectric 206 may be deposited by a low-pressure CVD process using $Ta(OC_2H_5)_5$ and $O_2$ at about 430° C., and may be subsequently annealed in order to reduce leakage current characteristics. Thin-film deposition techniques such as evaporation (e.g., thermal, e-beam), physical vapor deposition (PVD) (e.g., dc reactive sputtering, rf magnetron sputtering, ion beam sputtering), chemical vapor deposition (CVD), atomic layer deposition (ALD), pulsed laser deposition (PLD), molecular beam epitaxy (MBE), and the like may be employed. Additionally, alternate methods may also be employed for depositing the various transistor layers of the embodiments of the present disclosure. Such alternate methods can include anodization (electrochemical oxidation) of a metal film, as well as deposition from a liquid precursor such as spin coating and ink-jet printing including thermal ink-jet and piezoelectric drop-on-demand printing. Film patterning may employ photolithography combined with etching or lift-off processes, or may use alternate techniques such as shadow masking. Doping of one or more of the layers (e.g., the channel illustrated in FIG. 2) may also be accomplished by the introduction of oxygen vacancies and/or substitution of aliovalent elements such as Si, Ge, Sn, F, and N.

Embodiments of the present disclosure also include methods of forming metal containing films on a surface of a substrate or substrate assembly, such as a silicon wafer, with or without layers or structures formed thereon, used in forming integrated circuits, and in particular thin-film transistors as described herein. It is to be understood that methods of the present disclosure are not limited to deposition on silicon wafers; rather, other types of wafers (e.g., gallium arsenide, glass, etc.) can be used as well.

Furthermore, other substrates can also be used in methods of the present disclosure. These include, for example, fibers, wires, etc. In general, the films can be formed directly on the lowest surface of the substrate, or they can be formed on any of a variety of the layers (i.e., surfaces) as in a patterned wafer, for example.

Figure 3:
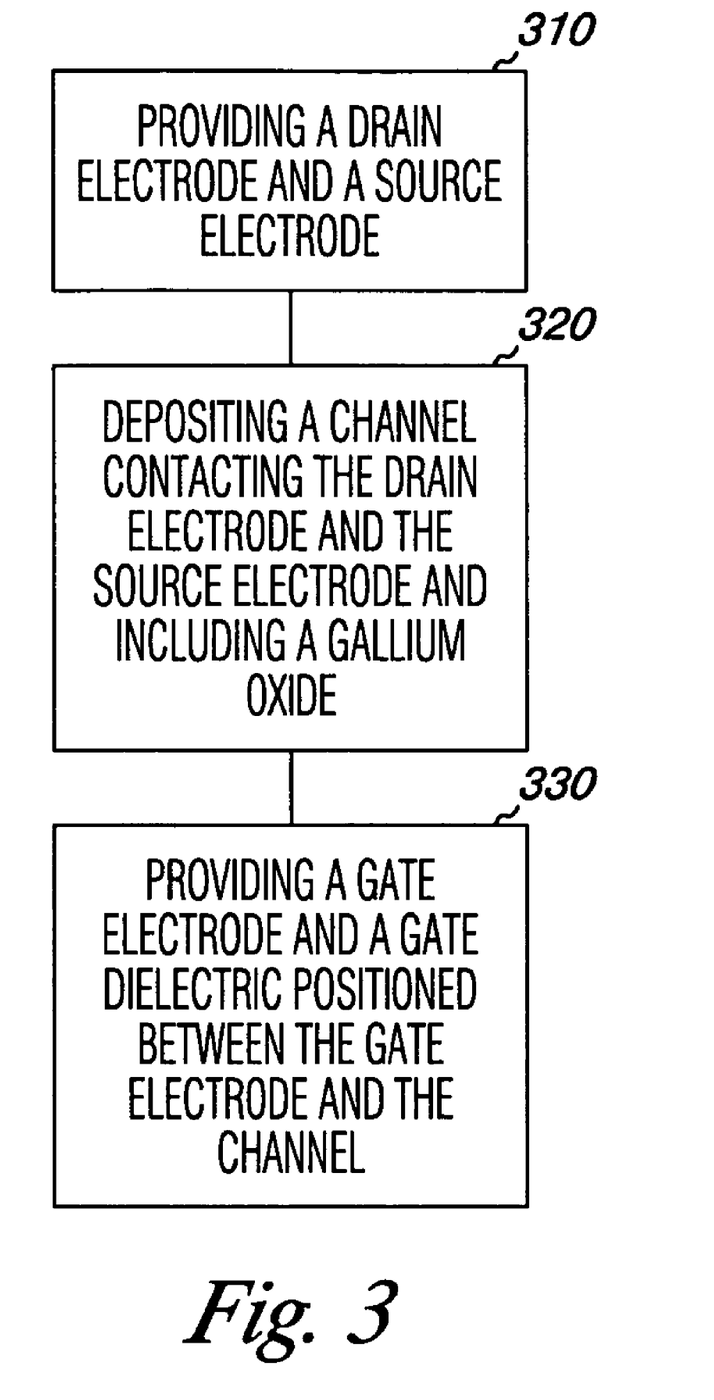
FIG. 3 illustrates a method embodiment for manufacturing an embodiment of a thin-film transistor.

In one embodiment, a method for fabricating a semiconductor structure is illustrated in FIG. 3. In the various embodiments of the disclosure, a substrate or substrate assembly can be provided in forming the semiconductor structure. As used herein, the term "substrate" refers to the base substrate material layer, e.g., the lowest layer of glass material in a glass wafer. The term "substrate assembly" refers to the substrate having one or more layers or structures formed thereon. Examples of substrate types include, but are not limited to, glass, plastic, and metal, and include such physical forms as sheets, films, and coatings, among others, and may be opaque or substantially transparent.

In block 310, a drain electrode and a source electrode can both be provided. For example, both the drain electrode and the source electrode can be provided on the substrate of substrate assembly.

In block 320, a channel contacting the drain electrode and the source electrode, and including gallium oxide, can be deposited. For example, the channel can be deposited between the drain electrode and a source electrode so as to electrically couple the two electrodes. In the various embodiments, depositing the channel contacting the drain electrode and the source electrode can include providing a precursor composition including one or more precursor compounds including gallium. Various combinations of the precursor compounds described herein can be used in the precursor composition. Thus, as used herein, a "precursor composition" refers to a solid or liquid that includes one or more precursor compounds of the formulas described herein optionally mixed with one or more compounds of formulas other than those described herein. For example, gallium precursor compounds can be provided in one precursor composition or in separate compositions. As used herein, "liquid" refers to a solution or a neat liquid (a liquid at room temperature or a solid at room temperature that melts at an elevated temperature). As used herein, a "solution" does not call for complete solubility of the solid; rather, the solution may have some undissolved material, more desirably, however, there is a sufficient amount of the material that can be carried by the organic solvent into the vapor phase for chemical vapor deposition processing. The gallium precursor compounds can also include one or more organic solvents suitable for use in a chemical vapor deposition system, as well as other additives, such as free ligands, that assist in the vaporization of the desired compounds.

A wide variety of gallium precursor compounds suitable for thin-film deposition techniques can be used with the embodiments of the present disclosure. Although specific compounds are illustrated herein, a wide variety of precursor compounds can be used as long as they can be used in a deposition process. In the various embodiments of the present disclosure, the gallium precursor compounds can include neutral compounds and may be liquids or solids at room temperature. If they are solids, they are sufficiently soluble in an organic solvent to allow for vaporization, they can be vaporized or sublimed, or ablated (e.g., by laser ablation or sputtering) from the solid state, or they have melting temperatures below their decomposition temperatures. Thus, many of the precursor compounds described herein are suitable for use in vapor deposition techniques, such as chemical vapor deposition (CVD) techniques, (e.g., flash vaporization techniques, bubbler techniques, and/or microdroplet techniques).

The precursor compounds described herein can be used in precursor compositions for ink-jet deposition, sputtering, and vapor deposition techniques (e.g., chemical vapor deposition (CVD) or atomic layer deposition (ALD)). Alternatively, certain compounds described herein can be used in other deposition techniques, such as spin-on coating, and the like. Typically, those compounds containing organic R groups with a low number of carbon atoms (e.g., 1-4 carbon atoms per R group) are suitable for use with vapor deposition techniques. Those compounds containing organic R groups with a higher number of carbon atoms (e.g., 5-12 carbon atoms per R group) are generally suitable for spin-on or dip coating.

As used herein, the term "organic R groups" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present disclosure, the organic groups are those that do not interfere with the formation of a metal-containing film. They may be of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Still referring to FIG. 3, the channel of gallium oxide from the precursor composition can be deposited on a surface of the substrate or substrate assembly. For example, the channel of gallium oxide can be deposited from the precursor composition to contact the drain electrode and the source electrode of a thin-film transistor, thereby electrically coupling the drain and source electrodes. In various embodiments, the channel can employ a physical vapor deposition technique such as sputter coating, which can include vaporizing the precursor composition and directing it toward the substrate or substrate assembly. Other methods for depositing the channel can include one or more physical vapor deposition techniques such as dc reactive sputtering, rf sputtering, magnetron sputtering, ion beam sputtering, or combinations thereof.

In the various embodiments, the gallium oxide included in the channel can have a uniform composition throughout its thickness, although this is not a requisite. For example, a first gallium precursor compound could be deposited first and then a combination of the first and a second gallium precursor compounds could be deposited with increasing amounts of the second gallium precursor compound as the film is formed. As will be appreciated, the thickness of the gallium oxide will be dependent upon the application for which it is used. For example, the thickness can have a range of about 1 nanometer to about 1,000 nanometers. In an alternative embodiment, the thickness can have a range of about 10 nanometers to about 200 nanometers. For example, the thickness range of about 10 nanometers to about 200 nanometers is applicable to gallium oxide forming the channel 108 of the thin-film transistor 100.

In the embodiments of the present disclosure, the precursor compounds can include one or more gallium precursor compounds. The gallium precursor compounds are typically mononuclear (i.e., monomers in that they contain one metal per molecule), although weakly bound dimers (i.e., dimers containing two monomers weakly bonded together through hydrogen or dative bonds) are also possible.

As discussed herein, the gallium precursor compounds for the gallium oxide for use in a sputtering process in the embodiments of the present disclosure can include Ga, GaO, $Ga_2O$, $Ga_2O_3$, and mixtures thereof. When the channel is deposited in a thin-film by sputtering by use of the above-mentioned target (e.g., substrate assembly), there can be obtained a single-phase crystalline state for the channel. In the various embodiments, the single-phase crystalline state can include compounds of the formula:

$$Ga_2O_3$$

Alternatively, embodiments of the gallium oxide can exhibit a mixed-phase crystalline state resulting from sputtering by use of the above-mentioned target. For example, the mixed-phase crystalline state can include, but is not limited to, two or more phases that can include, for example, GaO, $Ga_2O$, $Ga_2O_3$, and mixtures thereof, with a range of phase-to-phase ratio A:B:C (e.g., $GaO:Ga_2O:Ga_2O_3$), where A, B, and C are each in a range of about 0.025 to about 0.95. In additional embodiments, the gallium oxide can have a substantially amorphous form.

In block 330, both a gate electrode and a gate dielectric positioned between the gate electrode and the channel can be provided in forming an embodiment of the thin-film transistor of the present disclosure.

Figure 4A:
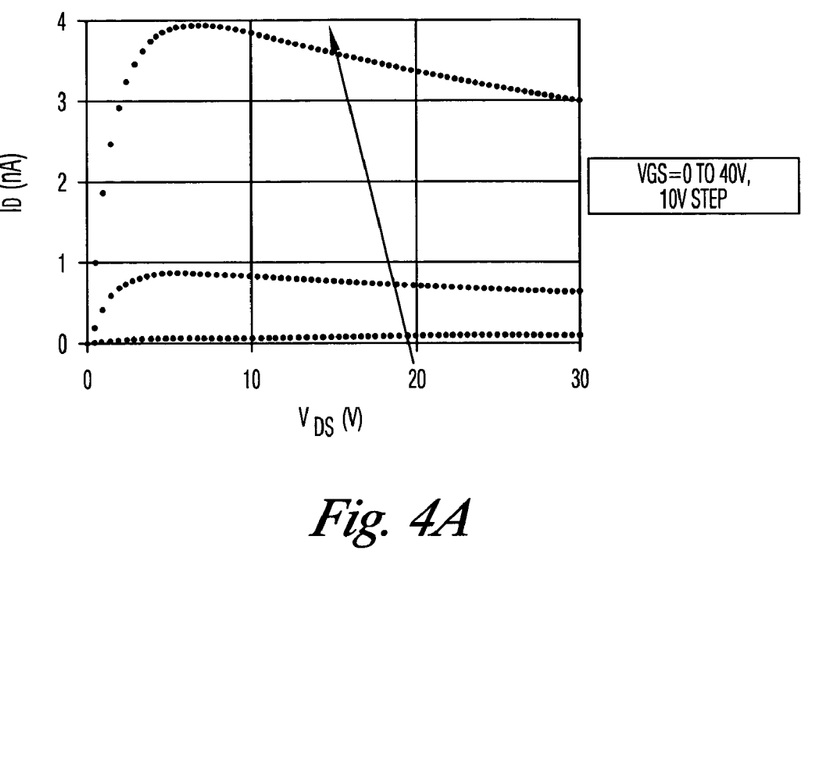
FIGS. 4A-4B illustrate electrical properties of the embodiment of the thin-film transistor illustrated in FIG. 2.
Figure 4B:
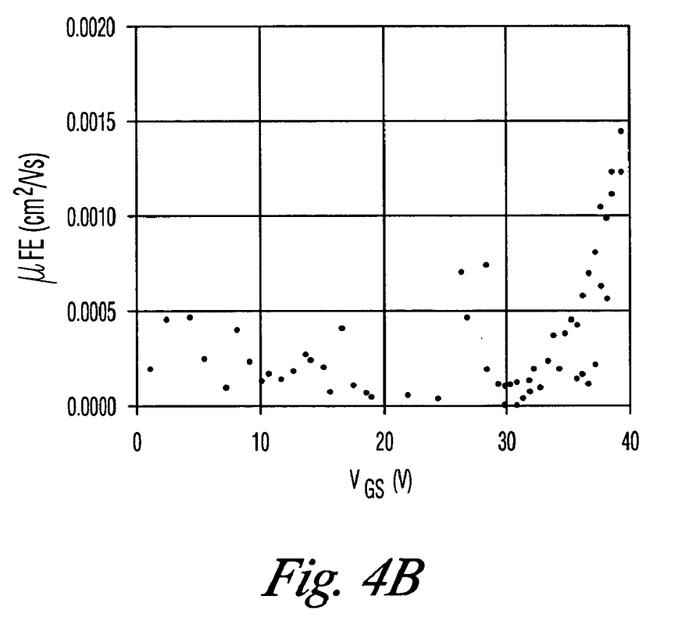

The following example is offered to further illustrate the techniques in which the various layers of the transistor may be deposited including the channel described in FIG. 3, specifically so as to obtain the electrical characteristics depicted in FIG. 4. It should be understood, however, that many variations and modifications may be made while remaining within the scope of the present disclosure.

A p-type Si wafer is thermally oxidized to form a 100 nm $SiO_2$ gate dielectric layer; the p-type wafer functions also as the gate dielectric in this transistor structure. $SiO_2$ is stripped from the wafer backside, and a Au gate contact layer is deposited. Gallium oxide (TFT channel) is deposited onto the $SiO_2$ gate dielectric layer via RF sputtering at 2.5 $W/cm^2$ from a ceramic target of $Ga_2O_3$. Gallium oxide sputtering is carried out at 5 mTorr of $Ar/O_2$ (95/5%); the substrate is unheated during deposition. ITO source and drain electrodes are deposited onto the gallium oxide channel. Prior to deposition of the source and drain electrodes, the stack is annealed in air at 600° C. for 1 hour. The resulting TFT structure shows a channel mobility of ~$10^{-3}$ $cm^2/V$ s. The $\beta$-$Ga_2O_3$ crystal structure is confirmed by x-ray diffraction (XRD) analysis.

Sputtering or chemical vapor deposition processes can be carried out in an atmosphere of inert gas and/or a reaction gas to form a relatively pure gallium oxide. The inert gas is typically selected from the group including nitrogen, helium, argon, and mixtures thereof. In the context of the present disclosure, the inert gas is one that is generally unreactive with the precursor compounds described herein and does not interfere with the formation of gallium oxide.

The reaction gas can be selected from a wide variety of gases reactive with the compound described herein, at least at a surface under the conditions of deposition. Examples of reaction gases include hydrogen and oxidizing gases such as $O_2$. Various combinations of carrier gases and/or reaction gases can be used in the embodiments of the present disclosure to form gallium oxide.

For example, in a sputtering process for gallium oxide, the process may be performed by using a mixture of argon and oxygen as the sputtering gas at a particular flow rate, with the application of an RF power for achieving the desired deposition in a sputter deposition chamber. However, it should be readily apparent that any manner of forming gallium oxide is contemplated in accordance with the present disclosure and is in no manner limited to any particular process, e.g., sputtering, for formation thereof.

The following example, shown in FIGS. 4A-4B, illustrates the electrical characteristics of a thin-film transistor with a gallium oxide channel. In this example a p-type Si wafer functions as the transistor gate electrode. The gate dielectric is comprised of a $SiO_2$ layer with an approximate thickness of 100 nm. The channel is comprised of a gallium oxide layer with an approximate thickness of 50 nm. The source and drain electrodes are comprised of a layer of ITO having a thickness of about 200 nm.

FIG. 4A illustrates drain current vs. drain-to-source voltage ($I_D$-$V_{DS}$) characteristics of the thin-film transistor. In this embodiment, the channel width W and the channel length L were set to yield a channel width-to-length ratio of W/L=10. The gate-to-source voltage ($V_{GS}$) is varied from 0 to 40V in increments of 10V to generate the depicted family of $I_D$-$V_{DS}$ curves. The drain and gate voltages employed in generating these curves are rather large compared to those typically employed for some field effect transistors (FETs). The use of a reduced voltage range would not prevent device operation, however would reduce the maximum attainable drive current. Alternatively, drain and gate voltages can be reduced by reducing the gate insulator thickness. In this example, the gate dielectric (i.e., gate insulator) is ~100 nm thick. However, if an otherwise identical insulator is rescaled to a thickness of 20 nm, the gate and drain voltages used to attain a similar drain current will be reduced by a factor of approximately 5.

FIG. 4B illustrates the field effect mobility of the thin-film transistor, extracted from measurement of $I_D$ vs. $V_{GS}$, at low (fixed) $V_{DS}$. The thin-film transistor with gallium oxide channel shows a maximum field effect mobility of about $10^{-3}$ cm²/Vs. The channel mobility increases with increasing gate-source voltage.

Figure 5:
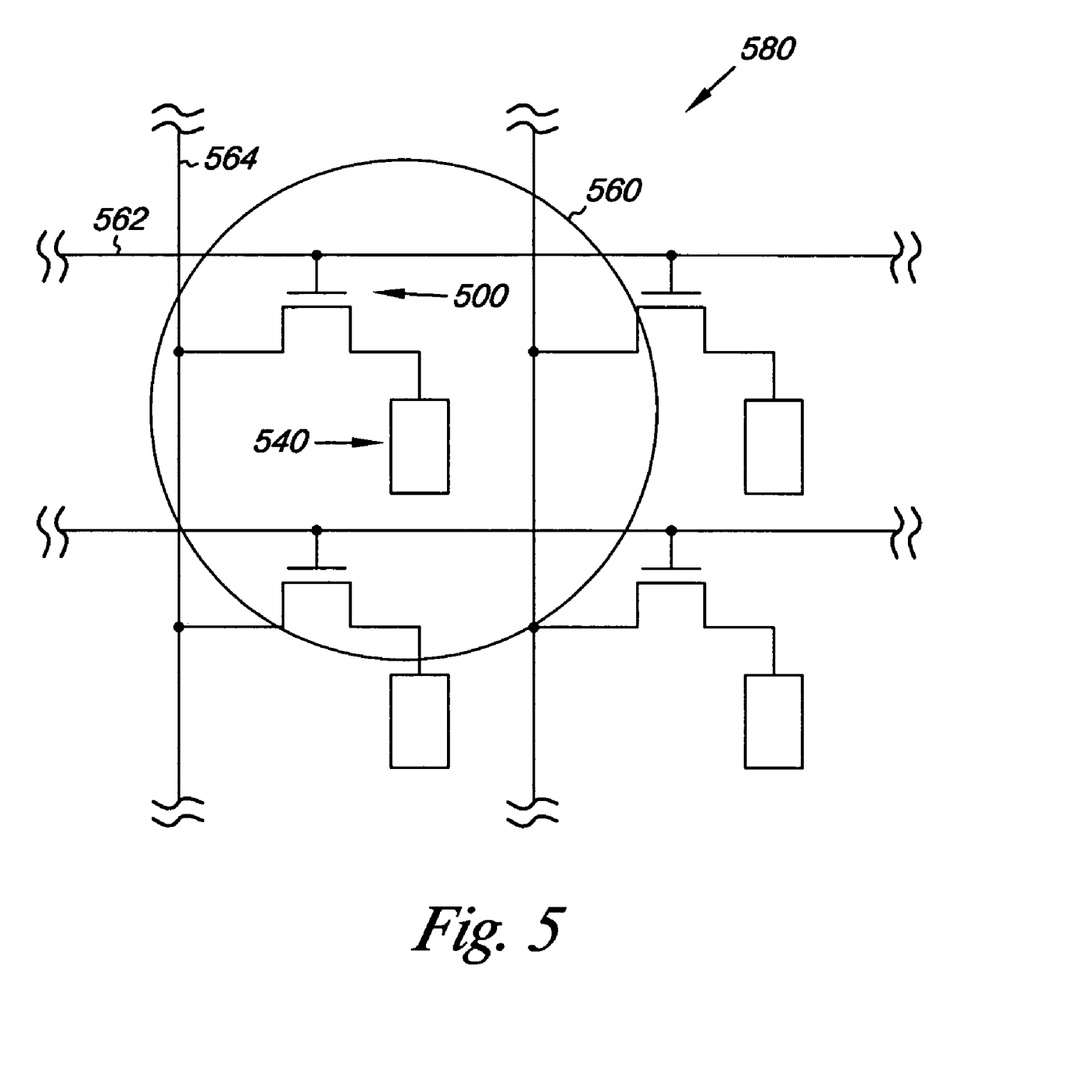
FIG. 5 illustrates an embodiment of an active matrix display area.

The embodiments described herein may be used for fabricating chips, integrated circuits, monolithic devices, semiconductor devices, and microelectronic devices, such as display devices. For example, FIG. 5 illustrates an embodiment of a display device such as an active-matrix liquid-crystal display (AMLCD) 580. In FIG. 5, the AMLCD 580 can include pixel devices (i.e., liquid crystal elements) 540 in a matrix of a display area 560. The pixel devices 540 in the matrix can be coupled to thin-film transistors 500 also located in the display area 560. The thin-film transistor 500 can include embodiments of the thin-film transistors as disclosed herein. Additionally, the AMLCD 580 can include orthogonal control lines 562 and 564 for supplying an addressable signal voltage to the thin-film transistors 500 to influence the thin-film transistors to turn on and off and control the pixel devices 540, e.g., to provide an image on the AMLCD 580.

Although specific exemplary embodiments have been illustrated and described herein, those of ordinary skill in the art will appreciate that an arrangement calculated to achieve the same techniques can be substituted for the specific exemplary embodiments shown. This disclosure is intended to cover adaptations or variations of the embodiments of the disclosure. It is to be understood that the above description has been made in an illustrative fashion, and not a restrictive one.

Combination of the above exemplary embodiments, and other embodiments not specifically described herein will be apparent to those of skill in the art upon reviewing the above description. The scope of the various embodiments of the invention includes other applications in which the above structures and methods are used. Therefore, the scope of various embodiments of the invention should be determined with reference to the appended claims, along with the full range of equivalents to which such claims are entitled.

In the foregoing Detailed Description, various features are grouped together in a single exemplary embodiment for the purpose of streamlining the disclosure. This method of disclosure is not to be interpreted as reflecting an intention that the embodiments of the invention necessitate more features than are expressly recited in each claim. Rather, as the following claims reflect, inventive subject matter lies in less than all features of a single disclosed exemplary embodiment. Thus, the following claims are hereby incorporated into the Detailed Description, with each claim standing on its own as a separate embodiment.

What is claimed is:

1. A semiconductor device, comprising:
   a drain electrode;
   a source electrode;
   a channel contacting the drain electrode and the source electrode, wherein the channel includes gallium oxide $Ga_2O_3$ with dopant selected from a group consisting of oxygen vacancies Si and Ge;
   a gate electrode; and
   a gate dielectric positioned between the gate electrode and the channel.

2. The semiconductor device of claim 1, wherein gallium oxide includes a single-phase crystalline form of β-$Ga_2O_3$ with dopant selected from a group consisting of oxygen vacancies Si and Ge.

3. The semiconductor device of claim 1, wherein gallium oxide includes an amorphous form from compounds selected from the group consisting of GaO, $Ga_2O$, $Ga_2O_3$, and mixtures thereof.

4. The semiconductor device of claim 1, wherein the channel includes being positioned between and electrically coupling the drain electrode and the source electrode.

5. The semiconductor device of claim 1, wherein at least one of the drain electrode, the source electrode, the channel, gate electrode, the gate dielectric, and combinations thereof are substantially transparent.

6. The semiconductor device of claim 1, wherein gallium oxide includes a mixed-phase crystalline form from compounds selected from the group consisting of GaO, $Ga_2O$, $Ga_2O_3$, and mixtures thereof.

7. The semiconductor device of claim 6, wherein gallium oxide includes GaO:$Ga_2O$:$Ga_2O_3$ in a ratio of A:B:C, wherein A, B, and C are each in a range of about 0.025 to about 0.95.

8. A semiconductor device, comprising:
   a drain electrode;
   a source electrode;
   means for carrying electron flow to electrically couple the drain electrode and the source electrode, wherein the means for a channel includes means for $Ga_2O_3$ with dopant selected from a group consisting of oxygen vacancies Si and Ge;
   a gate electrode; and
   a gate dielectric positioned between the gate electrode and the channel.

9. The semiconductor device of claim 8, wherein the means for a channel includes a single-phase crystalline form of β-$Ga_2O_3$ with dopant selected from a group consisting of oxygen vacancies Si and Ge.

10. The semiconductor device of claim 8, wherein the means for a channel includes means for forming a mixed-phase crystalline form from compounds selected from the group consisting of GaO, $Ga_2O$, $Ga_2O_3$, and mixtures thereof.

11. The semiconductor device of claim 8, wherein the means for a channel includes means for forming an amorphous form from compounds selected from the group consisting of GaO, $Ga_2O$, $Ga_2O_3$, and mixtures thereof.

12. The semiconductor device of claim 8, wherein at least one of the drain electrode, the source electrode, the channel, gate electrode, the gate dielectric, and combinations thereof are substantially transparent.

13. A semiconductor device formed by the steps, comprising:
   providing a drain electrode;
   providing a source electrode;
   providing a precursor composition including one or more compounds of a gallium precursor compound, wherein the means for a channel includes means for $Ga_2O_3$ with dopant selected from a group consisting of oxygen vacancies Si and Ge;
   depositing a channel of gallium oxide from the precursor composition to contact the drain electrode and the source electrode;
   providing a gate electrode; and
   providing a gate dielectric positioned between the gate electrode and the channel.

14. The semiconductor device of claim 13, wherein depositing the channel includes:
   vaporizing the precursor composition to form vaporized precursor composition; and
   depositing the vaporized precursor composition using a physical vapor deposition technique.

15. The semiconductor device of claim 14, wherein the physical vapor deposition technique includes one or more of dc sputtering, rf sputtering, magnetron sputtering, and ion beam sputtering.

16. A display device, comprising:
   a plurality of display elements configured to operate collectively to display images, where each of the display elements includes a semiconductor device configured to control light emitted by the display element, the semiconductor device including:
   a drain electrode;
   a source electrode;
   a channel contacting the drain electrode and the source electrode, wherein the channel includes gallium oxide $Ga_2O_3$ with dopant selected from a group consisting of oxygen vacancies Si and Ge;
   a gate electrode; and
   a gate dielectric positioned between the gate electrode and the channel and configured to permit application of an electric field to the channel.

17. The display device of claim 16, wherein gallium oxide includes a single-phase crystalline form of β-$Ga_2O_3$ with dopant selected from a group consisting of oxygen vacancies Si and Ge.

18. The display device of claim 16, wherein gallium oxide includes an amorphous form from compounds selected from the group consisting of GaO, $Ga_2O$, $Ga_2O_3$, and mixtures thereof.

19. The display device of claim 16, wherein at least one of the drain electrode, the source electrode, the channel, gate electrode, the gate dielectric, and combinations thereof are substantially transparent.

20. The display device of claim 16, wherein gallium oxide includes a mixed-phase crystalline form from compounds selected from the group consisting of GaO, $Ga_2O$, $Ga_2O_3$, and mixtures thereof.

21. The display device of claim 20, wherein gallium oxide includes GaO:$Ga_2O$:$Ga_2O_3$ in a ratio of A:B:C, wherein A, B, and C are each in a range of about 0.025 to about 0.95.

* * * * *

UNITED STATES PATENT AND TRADEMARK OFFICE
CERTIFICATE OF CORRECTION

PATENT NO.       : 7,250,627 B2                                        Page 1 of 1
APPLICATION NO.  : 10/799325
DATED            : July 31, 2007
INVENTOR(S)      : Randy L. Hoffman It is certified that error appears in the above-identified patent and that said Letters Patent is hereby corrected as shown below:

On the title page, item (56), under "Other Publications", in column 2, line 14, delete "Al2O3" and insert -- $Al_2O_3$ --, therefor.

Signed and Sealed this

Eleventh Day of November, 2008

JON W. DUDAS
*Director of the United States Patent and Trademark Office*